United States Patent
Zhao et al.

(10) Patent No.: US 7,859,367 B2
(45) Date of Patent: Dec. 28, 2010

(54) NON-COPLANAR HIGH-SPEED INTERCONNECTS

(75) Inventors: Yan Yang Zhao, Fremont, CA (US);
Yuheng Lee, San Jose, CA (US);
Jianying Zhou, Acton, MA (US)

(73) Assignee: Finisar Corporation, Sunnyvale, CA (US)

( * ) Notice: Subject to any disclaimer, the term of this patent is extended or adjusted under 35 U.S.C. 154(b) by 253 days.

(21) Appl. No.: 12/248,456

(22) Filed: Oct. 9, 2008

(65) Prior Publication Data

US 2009/0033442 A1 Feb. 5, 2009

Related U.S. Application Data

(63) Continuation-in-part of application No. 12/030,142, filed on Feb. 12, 2008.

(60) Provisional application No. 60/889,469, filed on Feb. 12, 2007, provisional application No. 60/974,386, filed on Sep. 21, 2007, provisional application No. 60/982,666, filed on Oct. 25, 2007.

(51) Int. Cl.
*H03H 7/38* (2006.01)
*H01P 1/04* (2006.01)

(52) U.S. Cl. ........................ 333/260; 333/33

(58) Field of Classification Search ................ 333/33, 333/238, 246, 247, 254, 260
See application file for complete search history.

(56) References Cited

U.S. PATENT DOCUMENTS

| | | | |
|---|---|---|---|
| 5,561,405 A | 10/1996 | Hoffmeister et al. | |
| 5,675,302 A * | 10/1997 | Howard et al. | 333/243 |
| 6,062,872 A | 5/2000 | Strange et al. | |
| 6,407,652 B1 * | 6/2002 | Kan | 333/260 |
| 6,599,031 B2 | 7/2003 | Li | |
| 6,614,325 B1 | 9/2003 | Kocin | |
| 6,876,836 B2 | 4/2005 | Lin et al. | |
| 6,949,992 B2 | 9/2005 | Sweeney et al. | |
| 7,076,123 B2 | 7/2006 | Kirkpatrick et al. | |
| 2003/0179055 A1 | 9/2003 | Sweeney et al. | |
| 2003/0222282 A1 | 12/2003 | Fjelstad et al. | |
| 2005/0224946 A1 | 10/2005 | Dutta | |
| 2005/0237137 A1 | 10/2005 | Dutta | |
| 2005/0239418 A1 | 10/2005 | Koh et al. | |
| 2006/0028305 A1 | 2/2006 | Dutta et al. | |

FOREIGN PATENT DOCUMENTS

KR 10-2005-0030022 3/2005

* cited by examiner

*Primary Examiner*—Stephen E Jones
(74) *Attorney, Agent, or Firm*—Workman Nydegger

(57) ABSTRACT

In one example embodiment, a high-speed package includes first and second layers and a multi-channel non-coplanar interconnect. The first layer includes first and second sets of coplanar transmission lines. The second layer includes third and fourth sets of coplanar transmission lines. The multi-channel non-coplanar interconnect includes first and second channels. The first channel connects the first set of transmission lines to the third set of transmission lines. The second channel connects the second set of transmission lines to the fourth set of transmission lines.

20 Claims, 12 Drawing Sheets

NON-COPLANAR HIGH-SPEED INTERCONNECTS

CROSS-REFERENCE TO RELATED APPLICATIONS

The present application is a continuation-in-part application of U.S. patent application Ser. No. 12/030,142, filed Feb. 12, 2008 and entitled "High-Speed Interconnects," which claims the benefit of the following three applications: U.S. Provisional Patent Application Ser. No. 60/889,469, filed Feb. 12, 2007 and entitled "High-Speed Interconnect System Over a Printed Circuit Board," U.S. Provisional Patent Application Ser. No. 60/974,386, filed Sep. 21, 2007 and entitled "Non-Coplanar Interconnects," and U.S. Provisional Patent Application Ser. No. 60/982,666, filed Oct. 25, 2007 and entitled "Feed Thru with Flipped Signal Plane." Each of the foregoing applications is incorporated herein by reference in its entirety.

BACKGROUND

High-speed transponders generally require multiple high-speed interconnects. For example, a 40 G transponder may include various components that must be interconnected using high-speed interconnects capable of reliably transmitting signals at 40 G. Typically, manufacturers of high-speed transponders use coax cable and GPPO® or V-Connectors™ as high-speed interconnects.

While some high-speed transponders employ single-ended interconnects that require only one cable between components, other high-speed transponders employ differential interconnects that require two cables between components. Still other high-speed transponders employ multiple differential interconnects in a transmitter chain, and multiple differential signal interconnects in a receiver chain. The complexity and cost of a high-speed transponder increases with the number of cables used as interconnects. Employing coax cable and GPPO® or V-connectors™ as high-speed interconnects is expensive and can therefore limit the market potential of high-speed transponders.

BRIEF SUMMARY OF SOME EXAMPLE EMBODIMENTS

In general, example embodiments of the invention relate to high-speed interconnects for electrically connecting electrical signal routes between integrated circuits (ICs) and/or optoelectric circuits (OCs) and packages that include ICs and/or OCs.

In one example embodiment, a high-speed package includes first and second layers and a multi-channel non-coplanar interconnect. The first layer includes first and second sets of coplanar transmission lines. The second layer includes third and fourth sets of coplanar transmission lines. The multi-channel non-coplanar interconnect includes first and second channels. The first channel connects the first set of transmission lines to the third set of transmission lines. The second channel connects the second set of transmission lines to the fourth set of transmission lines.

In another example embodiment, a high-speed transponder includes a printed circuit board and first and second packages mounted to the printed circuit board. The printed circuit board includes first and second sets of coplanar traces. The first package includes first and second sets of coplanar high-speed transmission lines and the second package includes third and fourth sets of coplanar high-speed transmission lines. The high-speed transponder further includes first and second non-coplanar multi-channel interconnects. The first interconnect includes first and second channels and the second interconnect includes third and fourth channels. The first channel connects the first set of traces to the first set of transmission lines. The second channel connects the second set of traces to the second set of transmission lines. The third channel connects the first set of traces to the third set of transmission lines. The fourth channel connects the second set of traces to the fourth set of transmission lines.

In yet another example embodiment, a high-speed transponder includes a printed circuit board and an integrated circuit package and an optoelectric circuit package mounted to the printed circuit board. The printed circuit board includes first and second sets of coplanar traces. The integrated circuit package includes first and seconds sets of coplanar transmission lines and the optoelectric circuit package includes third and fourth sets of coplanar transmission lines. The high-speed transponder further includes first and second non-coplanar multi-channel interconnects. The first interconnect includes first and second channels and the second interconnect includes third and fourth channels. The first channel connects the first set of traces to the first set of transmission lines. The second channel connects the second set of traces to the second set of transmission lines. The third channel connects the first set of traces to the third set of transmission lines. The fourth channel connects the second set of traces to the fourth set of transmission lines.

These and other aspects of example embodiments of the invention will become more fully apparent from the following description and appended claims.

BRIEF DESCRIPTION OF THE DRAWINGS

To further clarify certain aspects of example embodiments of the invention, a more particular description of the invention will be rendered by reference to example embodiments thereof which are disclosed in the appended drawings. It is appreciated that these drawings depict only example embodiments of the invention and are therefore not to be considered limiting of its scope nor are they necessarily drawn to scale. Aspects of example embodiments of the invention will be described and explained with additional specificity and detail through the use of the accompanying drawings in which.

DETAILED DESCRIPTION OF SOME EXAMPLE EMBODIMENTS

In general, example embodiments disclosed herein are directed to high-speed interconnects for electrically connecting electrical signal routes between integrated circuits (ICs) and/or optoelectric circuits (OCs) and packages that include ICs and/or OCs. The term "high-speed" as used herein refers to data rates of about 15 G or above. For example, the term "high-speed" as used herein encompasses a data rate of about 40 G or about 100 G. Some example interconnects disclosed herein enable high-speed electrical signals, such as data, clock and other signals, to be transferred between packages via traces on a printed circuit board (PCB) that are configured for such transmission (PCB-based high-speed interconnects). Moreover, some example interconnects disclosed herein are configured such that standard package configurations can be employed, obviating the need for specialized IC and OC packages commonly used in high-speed transponders, such as GPPO® equipped packages. Additionally, example PCB-based high-speed interconnects disclosed herein are scalable such that high-speed data rates, such as 40 G, 100 G, or higher, can be accommodated. Thus, the example PCB-based high-speed interconnects disclosed herein can be employed to simplify the complexity of transponder design while enabling high-speed signal transfer to occur between its constituent packages. The example interconnects disclosed herein can be less expensive, and therefore have better market potential, than interconnects that employ relatively expensive coax cable and GPPO® or V-connectors™. Some example interconnects disclosed herein can also improve space efficiency within a high-speed transponder.

I. Example Transponders

Figure 1:
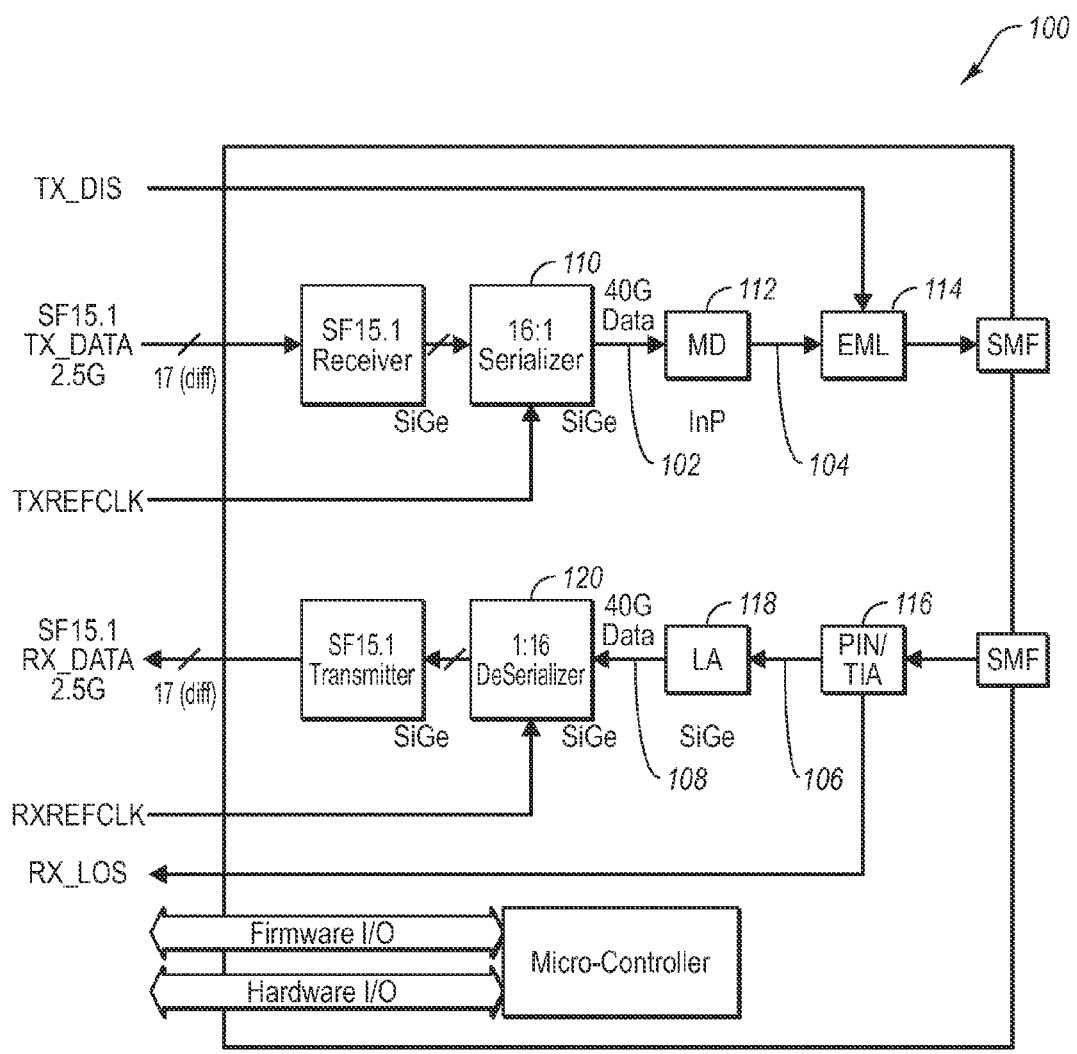
FIG. 1 is a simplified block diagram of an example high-speed transponder.

With reference first to FIG. 1, an example high-speed transponder 100 is disclosed. As disclosed in FIG. 1, the example transponder 100 has multiple 40 G interconnects 102-108. In particular, a serializer 110 is connected to a mod driver (MD) 112 via the 40 G interconnect 102. The MD 112 is connected to an electro absorption modulator+CW DFB laser (EML) 114 via the 40 G interconnect 104. In addition, a PIN/TIA 116 is connected to an LA 118 via the 40 G interconnect 106. The LA 118 is connected to a deserializer 120 via the 40 G interconnect 108. Each of the 40 G interconnects 102-108 can be implemented using aspects of the example PCB-based high-speed interconnects disclosed herein.

Figure 2:
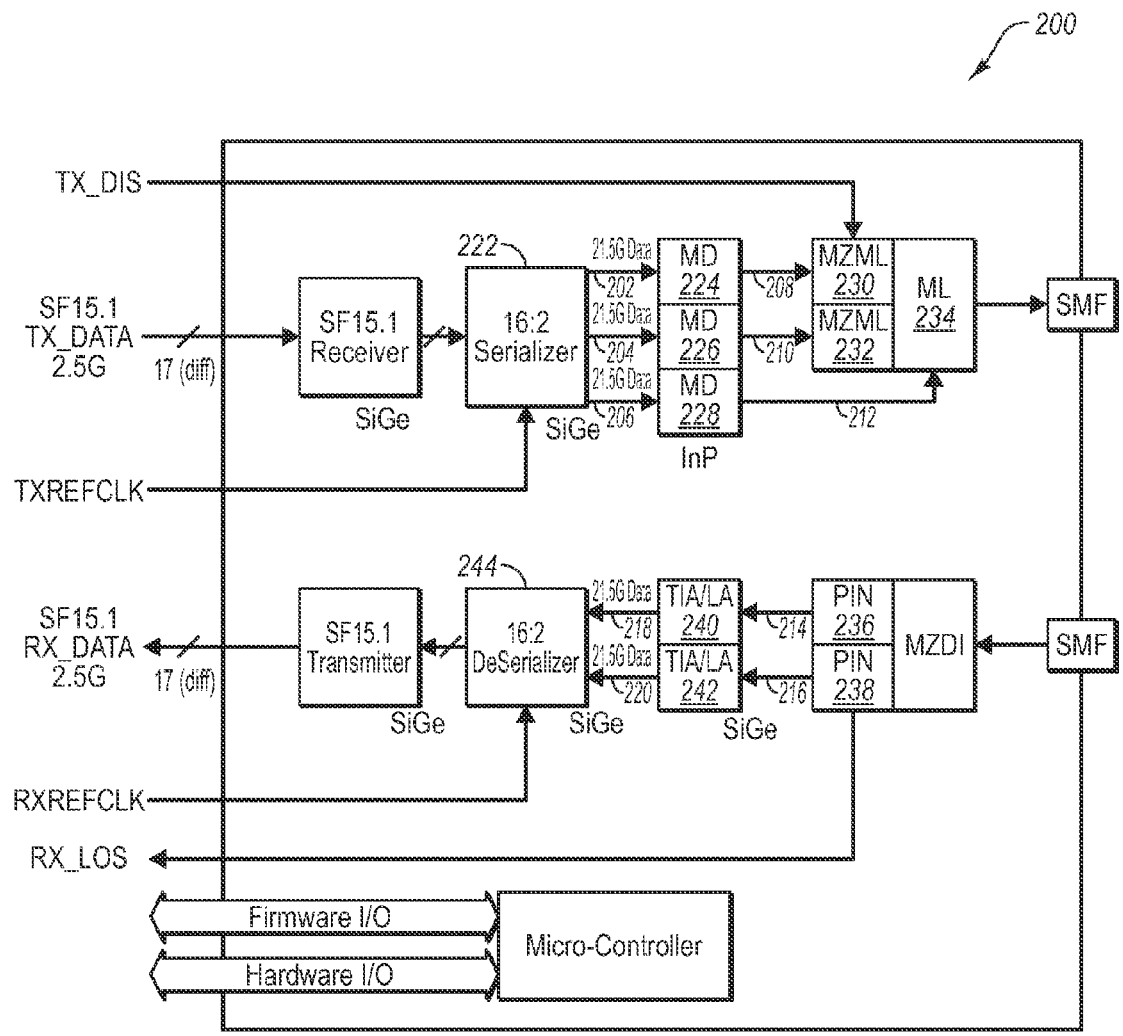
FIG. 2 is a simplified block diagram of another example high-speed transponder.

With reference now to FIG. 2, another example high-speed transponder 200 is disclosed. As disclosed in FIG. 2, the example transponder 200 has multiple 21.5 G interconnects 202-220. In particular, a serializer 222 is connected to MDs 224, 226, and 228 via the 21.5 G interconnects 202, 204, and 206, respectively. The MDs 224, 226, and 228 are connected to Mach Zender modulator lasers (MZMLs) 230 and 232 and a modulator (ML) 234 via the 21.5 G interconnects 208, 210, and 212, respectively. In addition, PINs 236 and 238 are connected to TIA/LAs 240 and 242 via the 21.5 G interconnects 214 and 216, respectively. The TIA/LAs 240 and 242 are connected to a deserializer 244 via the 21.5 G interconnects 218 and 220. Each of the 21.5 G interconnects 202-220 can be implemented using aspects of the example PCB-based high-speed interconnects disclosed herein. Where the 21.5 G interconnects 202-220 are single-ended, the 21.5 G PCB-based high-speed interconnects 202-220 can be employed instead of ten cables, resulting in significant cost savings. Where the 21.5 G interconnects 202-220 are differential, the 21.5 G PCB-based high-speed interconnects 202-220 can be employed instead of twenty cables, resulting in even greater cost savings.

II. Example Non-Coplanar Interconnects

With reference now to FIGS. 3-10, aspects of interconnects having non-coplanar geometries (non-coplanar interconnects) will be disclosed. The example non-coplanar interconnects disclosed herein can exhibit favorable RF performance in high-speed applications.

One environment in which the example non-coplanar interconnects disclosed herein can be employed is high-speed transponders. For example, transponders compliant with the 40 G 300 pin MSA may employ one or more of the example non-coplanar interconnects disclosed herein. Further, the example transponders 100 and 200 disclosed herein in connection with FIGS. 1 and 2, respectively, may employ one or more of the example non-coplanar interconnects disclosed herein. It is noted, however, that the example non-coplanar interconnects disclosed herein are not limited to employment in high-speed transponders, but can also be employed in any environment where an interconnect between two sets of high-speed transmission lines is necessary. The distance between the layers of traces or transmission lines disclosed herein is generally on the sub-millimeter scale, although other scales may also benefit from the example interconnects disclosed herein.

The term "non-coplanar" as used herein refers to an arrangement of transmission lines in an interconnect where the transmission lines are not substantially arranged in a single plane. For example, a non-coplanar interconnect could include ground transmission lines that are arranged in a first plane and signal transmission lines arranged in a second plane, where the first and second planes are substantially parallel or are not substantially parallel. Likewise, a non-coplanar interconnect could include transmission lines that are arranged in any geometry other than being substantially arranged in a single plane, such as a staggered geometry where the ground transmission lines and the signal transmission lines are not arranged in a pair of planes.

Figure 3:
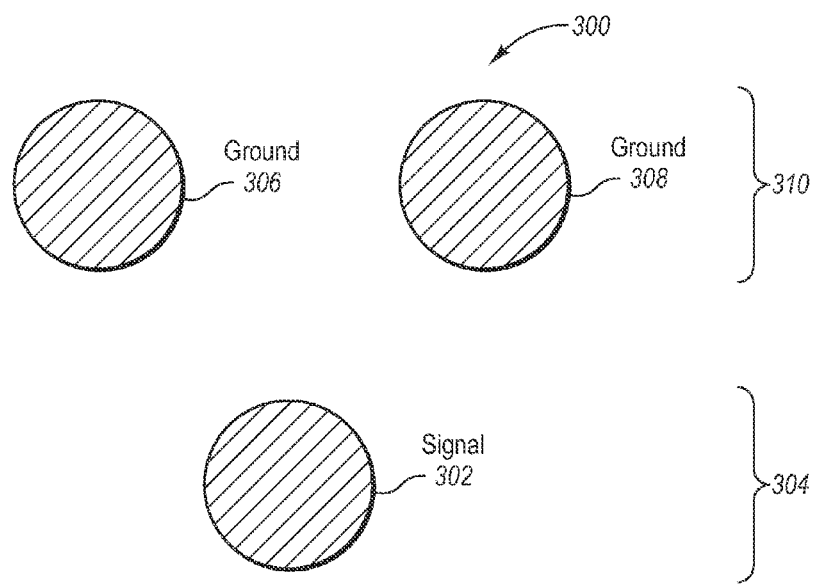
FIG. 3 is a top view of an example non-coplanar S/GG interconnect.

With reference now to FIG. 3, an example S/GG interconnect 300 is disclosed. As disclosed in FIG. 3, the example S/GG interconnect 300 includes one signal transmission line 302 arranged in a first plane 304 and two ground transmission lines 306 and 308 arranged in a second plane 310. Unlike a conventional coplanar GSG interconnect, the example S/GG interconnect 300 has a non-coplanar geometry. The example S/GG interconnect 300 can be employed in a high-speed application to connect a first set of GSG single-ended transmission lines (not shown) to a second set of GSG single-ended transmission lines (not shown). The first set and second set of GSG single-ended transmission lines can be arranged, for example, on first and second layers of a multi-layer package (not shown). Example multi-layer packages include, but are not limited to, a multi-layer High Temperature Co-fired Ceramic (HTCC) Ferro A-6 package or a multi-layer PCB.

Figure 4:
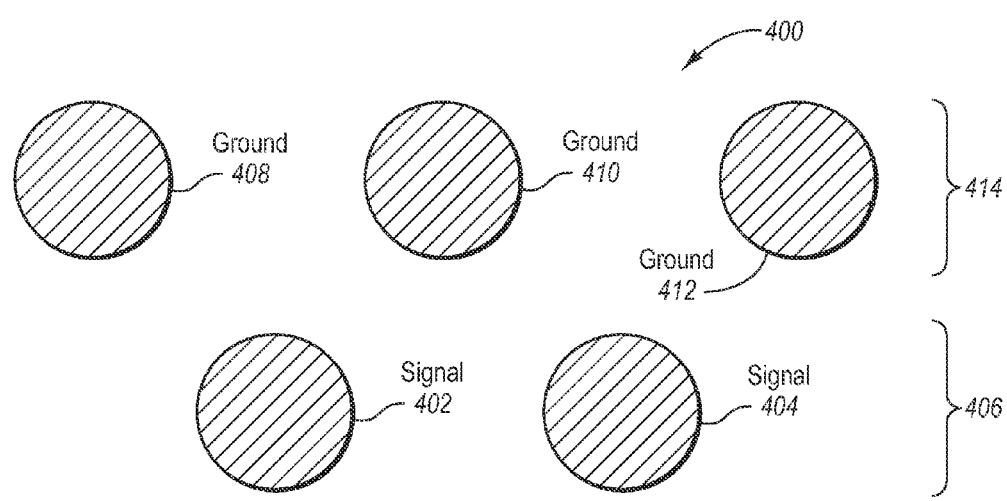
FIG. 4 is a top view of an example non-coplanar SS/GGG interconnect.

With reference now to FIG. 4, an example SS/GGG interconnect 400 is disclosed. As disclosed in FIG. 4, the example SS/GGG interconnect 400 includes two signal transmission lines 402 and 404 arranged in a first plane 406 and three ground transmission lines 408, 410, and 412 arranged in a second plane 414. Unlike a conventional coplanar GSGSG interconnect, the example SS/GGG interconnect 400 has a non-coplanar geometry. The example SS/GGG interconnect 400 can be employed in a high-speed application to connect a first set of GSGSG differential pair transmission lines (not shown) to a second set of GSGSG differential pair transmission lines (not shown), for example, on first and second layers of a multi-layer package (not shown).

Figure 5:
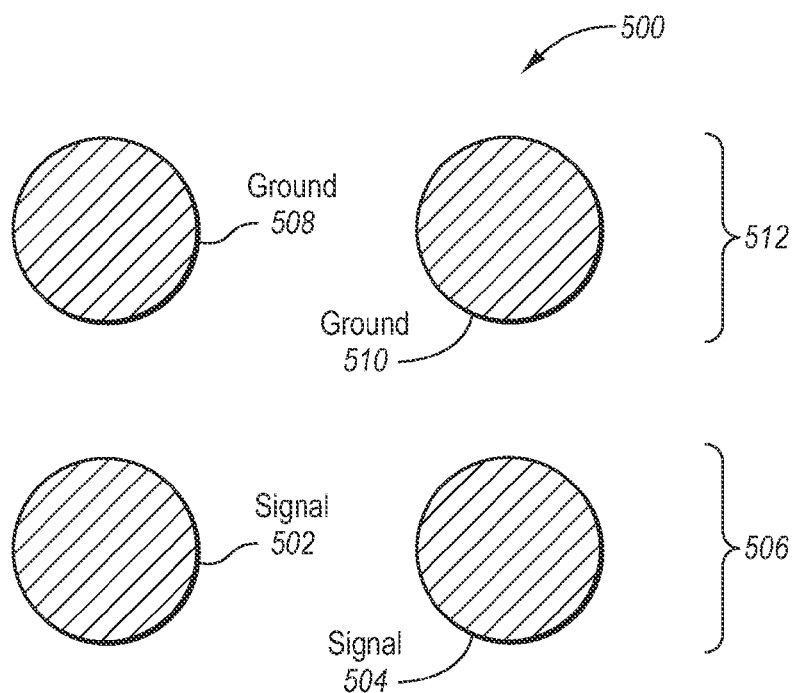
FIG. 5 is a top view of an example non-coplanar SS/GG interconnect.
Figure 6:
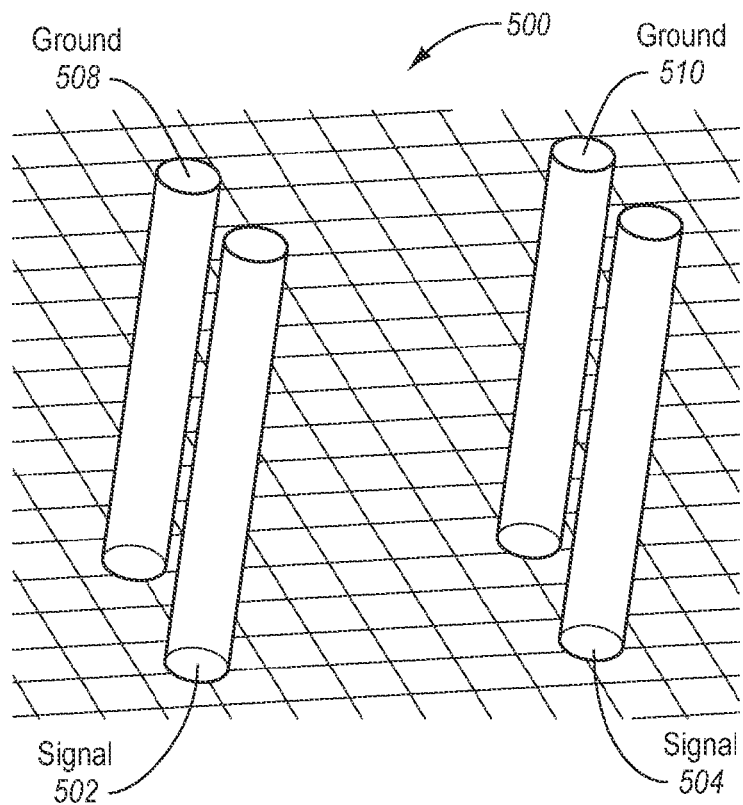
FIG. 6 is a perspective view the example non-coplanar SS/GG interconnect of FIG. 5.

With reference now to FIG. 5, an example SS/GG interconnect 500 is disclosed. As disclosed in FIG. 5, the example SS/GG interconnect 500 includes two signal transmission lines 502 and 504 arranged in a first plane 506 and two ground transmission lines 508 and 510 arranged in a second plane 512. Unlike a conventional coplanar GSSG interconnect, the example SS/GG interconnect 500 has a non-coplanar geometry. The example SS/GG interconnect 500 can be employed in a high-speed application to connect a first set of GSSG differential pair transmission lines to a second set of GSSG differential pair transmission lines, for example, on first and second layers of a multi-layer package, as discussed below in connection with FIGS. 7A and 7B. FIG. 6 is a perspective view of the example SS/GG interconnect 500 of FIG. 5.

Figure 7A:
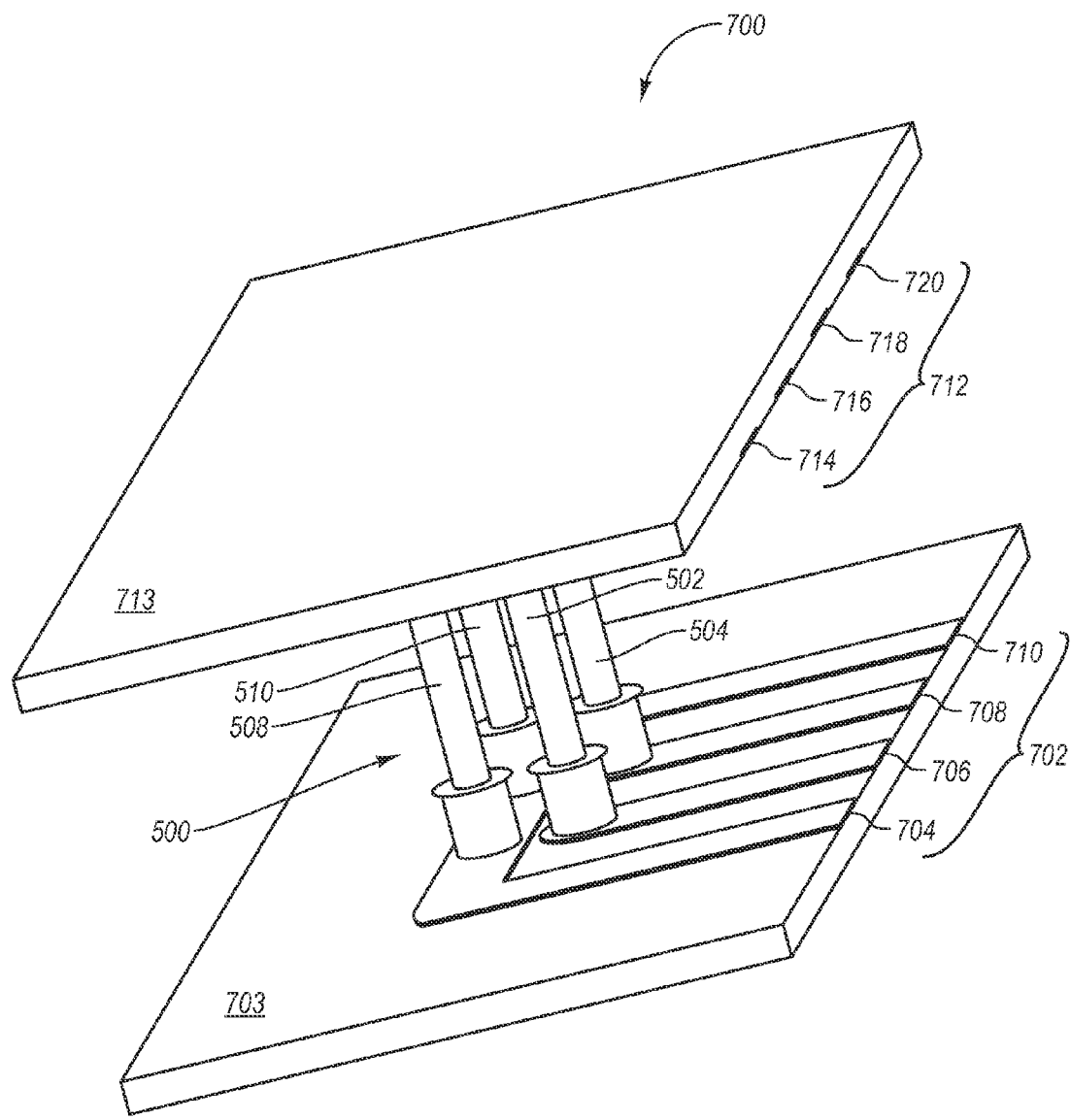
FIGS. 7A and 7B are perspective views of the example non-coplanar SS/GG interconnect of FIG. 5 employed in an example multi-layer package.
Figure 7B:
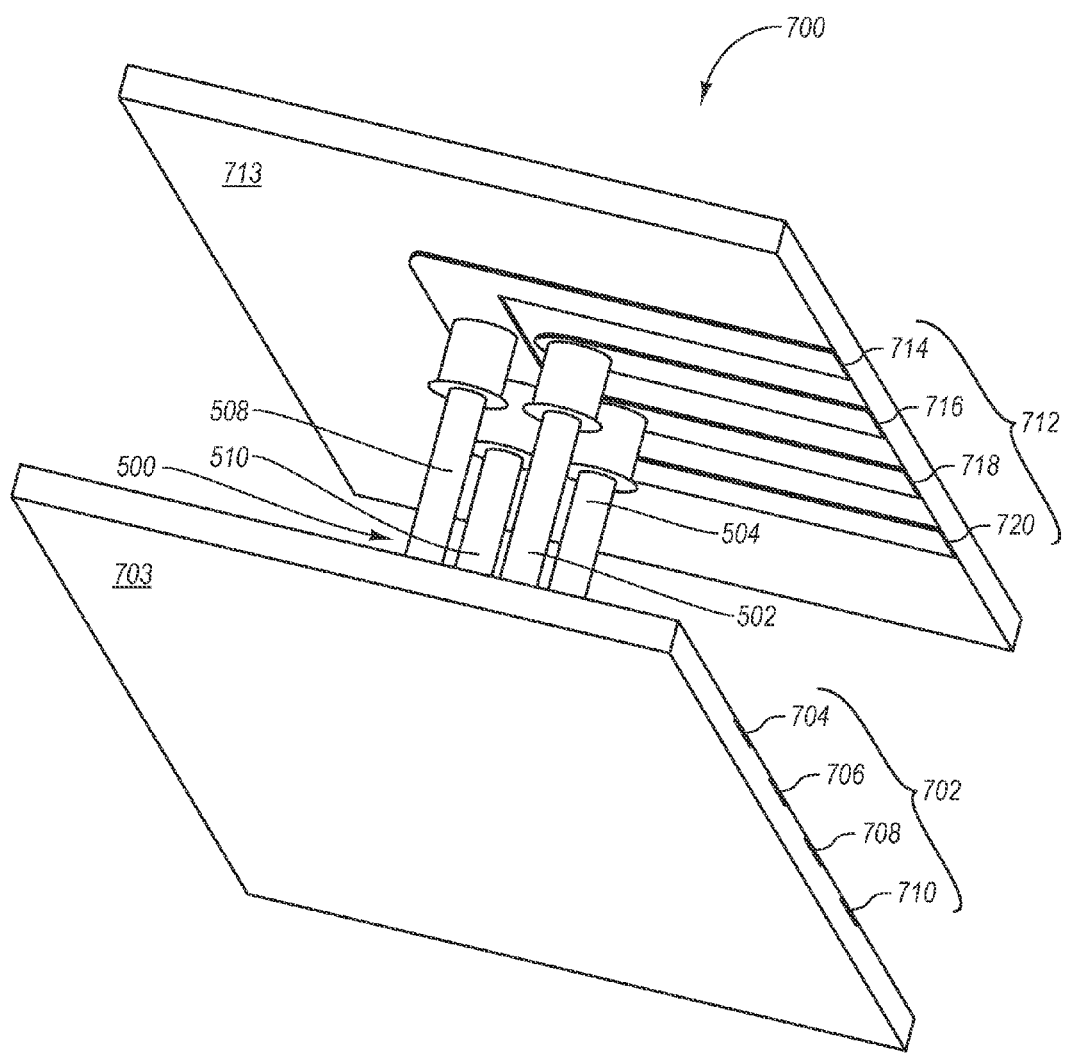

FIGS. 7A and 7B are perspective views of the example SS/GG interconnect 500 of FIGS. 5 and 6 employed in an example multi-layer package 700. As disclosed in FIG. 7A, the example SS/GG interconnect 500 is connected to a first set 702 of GSSG differential pair transmission lines on a first layer 703. The first set 702 of GSSG differential pair transmission lines includes a first ground line 704, a first signal line 706, a second signal line 708, and a second ground line 710. The two signal transmission lines 502 and 504 of the example SS/GG interconnect 500 are connected to the first and second signal lines 706 and 708, respectively. The two ground transmission lines 508 and 510 of the example SS/GG interconnect 500 are connected to the first and second ground lines 704 and 710, respectively. As disclosed in FIG. 7A, the first and second ground lines 704 and 710 may also be connected together.

As disclosed in FIG. 7B, the example SS/GG interconnect 500 connects the first set 702 of GSSG differential pair transmission lines to a second set 712 of GSSG differential pair transmission lines on a second layer 713. The second set 712 of GSSG differential pair transmission lines includes a first ground line 714, a first signal line 716, a second signal line 718, and a second ground line 720. The two signal transmission lines 502 and 504 of the example SS/GG interconnect 500 connect the signal line 706 to the signal line 716 and the signal line 708 to the signal line 718, respectively. The two ground transmission lines 508 and 510 of the example SS/GG interconnect 500 connect the ground line 704 to the ground line 714 and the ground line 710 to the ground line 720, respectively.

Although the multi-layer package 700 is disclosed in FIGS. 7A and 7B as having only two layers 703 and 713, it is contemplated that the example non-coplanar interconnects disclosed herein may also be implemented in multi-layer packages having three or more layers. Accordingly, the example non-coplanar interconnects disclosed herein may connect sets of transmission lines that are separated by one or more layers.

The example SS/GG interconnect 500 enables high-speed signals to be transmitted between the first set 702 of GSSG differential pair transmission lines arranged on the first layer 703 and the second set 712 of GSSG differential pair transmission lines arranged on the second layer 713. As discussed below in connection with FIGS. 8 and 9, the example SS/GG interconnect 500 enables high-speed signals to be transmitted between the first layer 703 and the second layer 713 with favorable RF performance at high-speeds.

Figure 8:
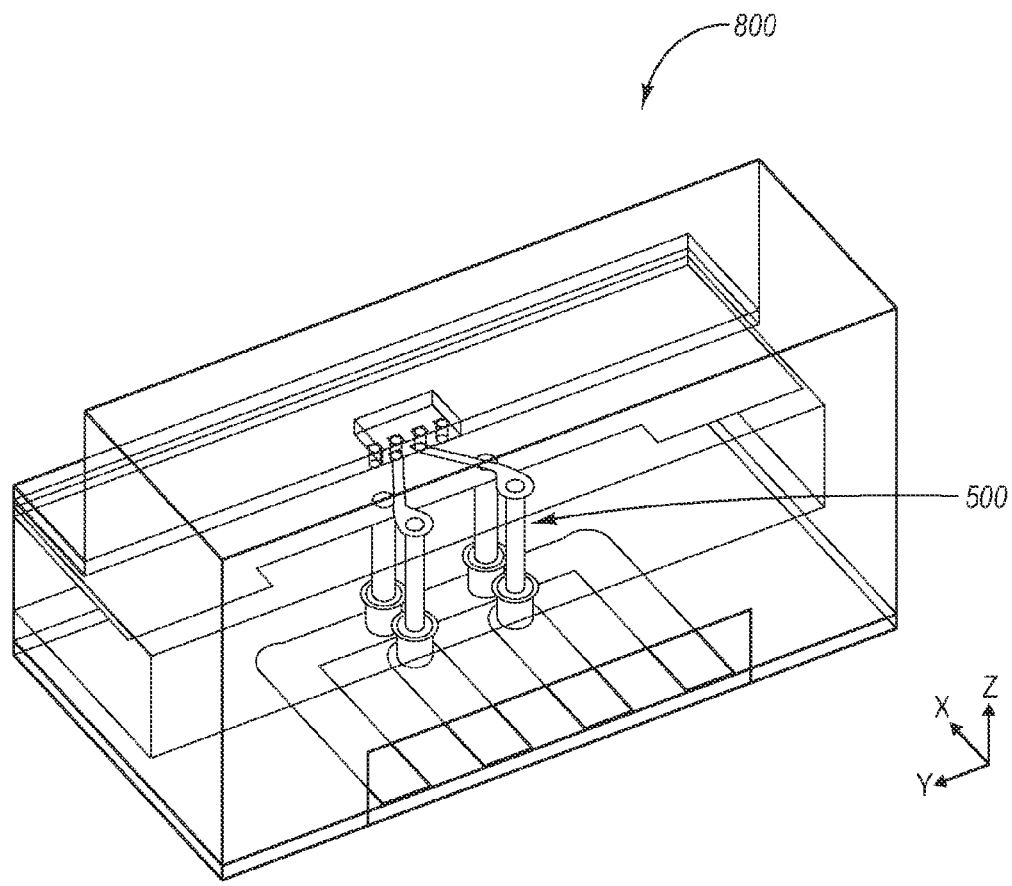
FIG. 8 is a perspective view of the example non-coplanar SS/GG interconnect of FIG. 5 employed in an example high-speed wideband performance simulation.

FIG. 8 is a perspective view of the example SS/GG interconnect 500 of FIG. 5 employed in an example high-speed wideband performance simulation 800. The charts disclosed in FIGS. 9 and 10 were generated using the example high-speed wideband performance simulation 800.

Figure 9:
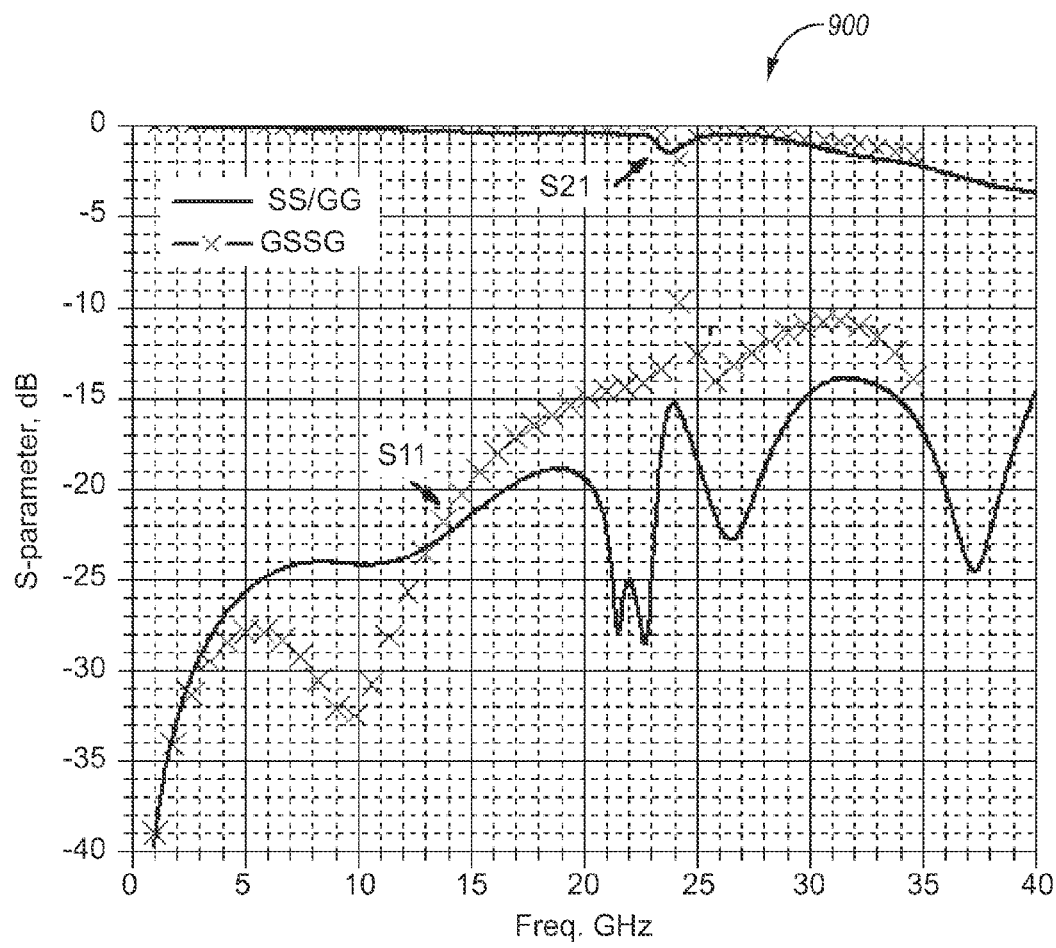
FIG. 9 is a chart comparing the forward transmission and reflection characteristics of a conventional coplanar GSSG interconnect and the example non-coplanar SS/GG interconnect of FIG. 5.

FIG. 9 is a chart 900 comparing the forward transmission (S21) and reflection (S11) characteristics of a conventional coplanar GSSG interconnect and the example SS/GG interconnect 500 of FIG. 5. As disclosed in FIG. 9, the example SS/GG interconnect 500 exhibits an average 5 dB reduction in reflection (S11) from about 15 GHz to about 35 GHz in comparison with the conventional coplanar GSSG interconnect.

Figure 10:
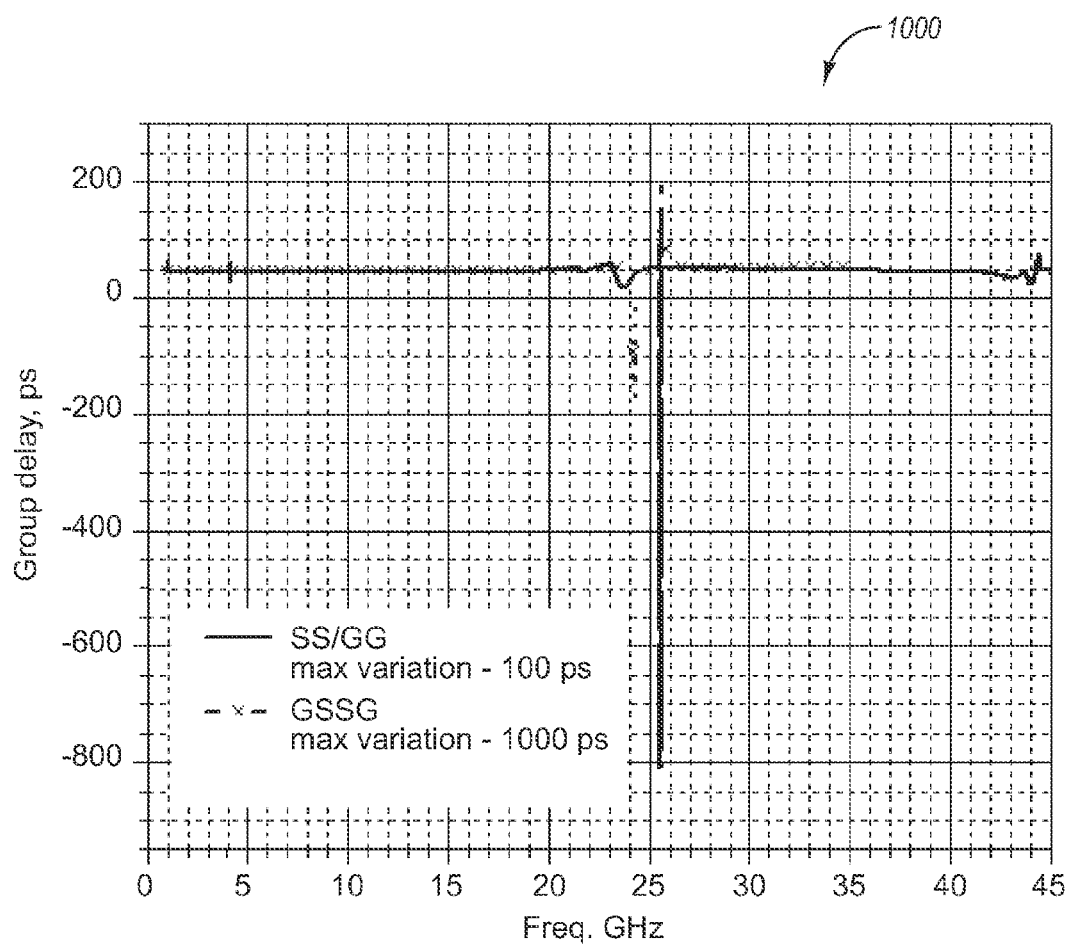
FIG. 10 is a chart comparing the group delay characteristics of a conventional coplanar GSSG interconnect and the example non-coplanar SS/GG interconnect of FIG. 5.

FIG. 10 is a chart 1000 comparing the group delay characteristics of a conventional coplanar GSSG interconnect and the example SS/GG interconnect of FIG. 5. As disclosed in FIG. 10, the example SS/GG interconnect 500 exhibits improved group delay characteristics in comparison with the conventional coplanar GSSG interconnect.

Figure 11:
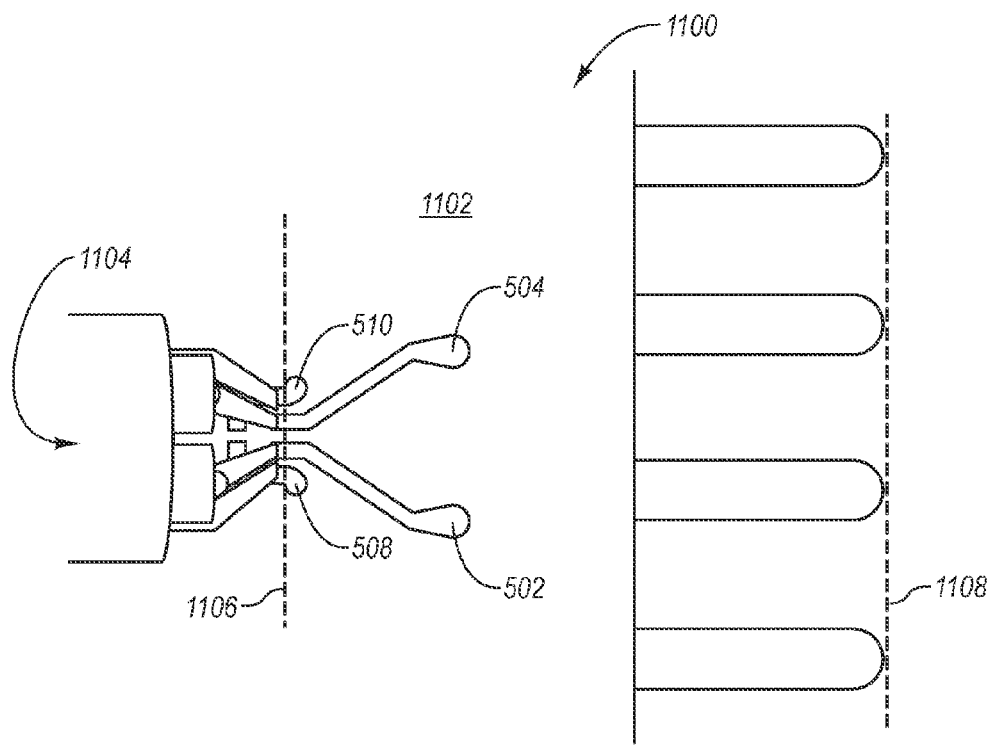
FIG. 11 is a top view of a test setup including an example SS/GG interconnect test coupon and a probe.

FIG. 11 is a top view of a test setup 1100 including an example SS/GG interconnect test coupon 1102 and a probe 1104. In one example embodiment, the probe 1104 may be an Air Coplanar® Probe (ACP40-GSG-xxx Probe) manufactured by Cascade Microtech, Inc. A first reference plane 1106 and a second reference plane 1108 are identified on the test coupon 1102 disclosed in FIG. 11. The example SS/GG interconnect test coupon 1102 includes two signal transmission lines 502 and 504 arranged in a first plane and two ground transmission lines 508 and 510 arranged in a second plane.

Figure 12:
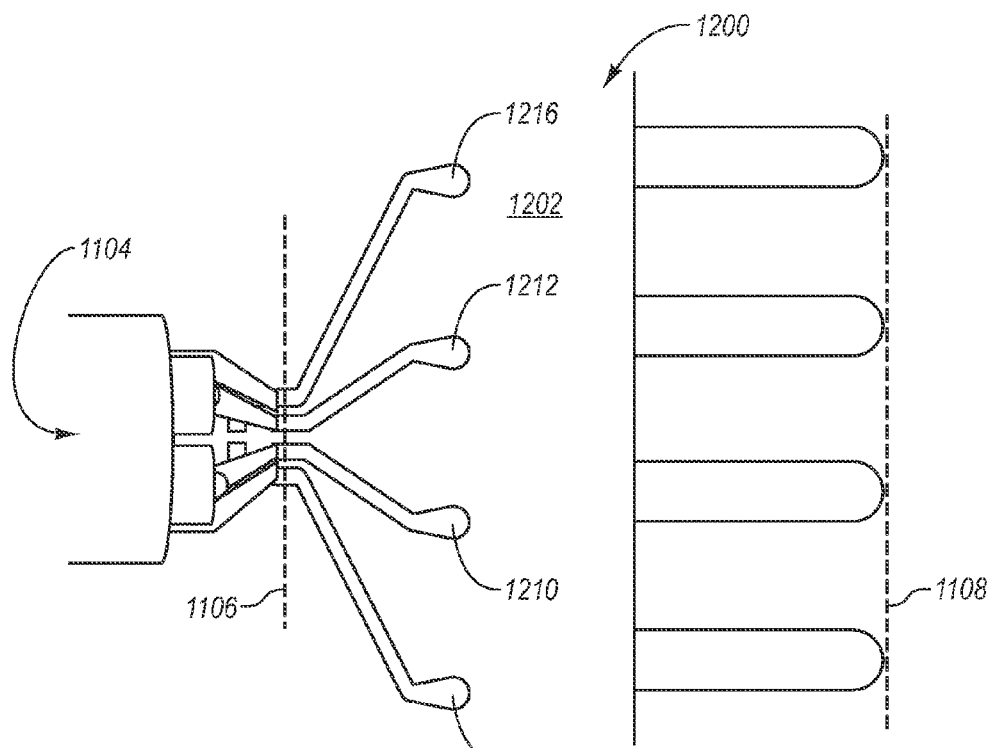
FIG. 12 is a top view of another test setup including a GSSG interconnect test coupon and a probe.

FIG. 12 is a top view of another test setup 1200 including a GSSG interconnect test coupon 1202 and the probe 1104. The first reference plane 1106 and the second reference plane 1108 are identified on the test coupon 1202 disclosed in FIG. 12. The GSSG interconnect test coupon 1202 includes two signal transmission lines 1210 and 1212 and two ground transmission lines 1214 and 1216 arranged in a single plane.

Figure 13:
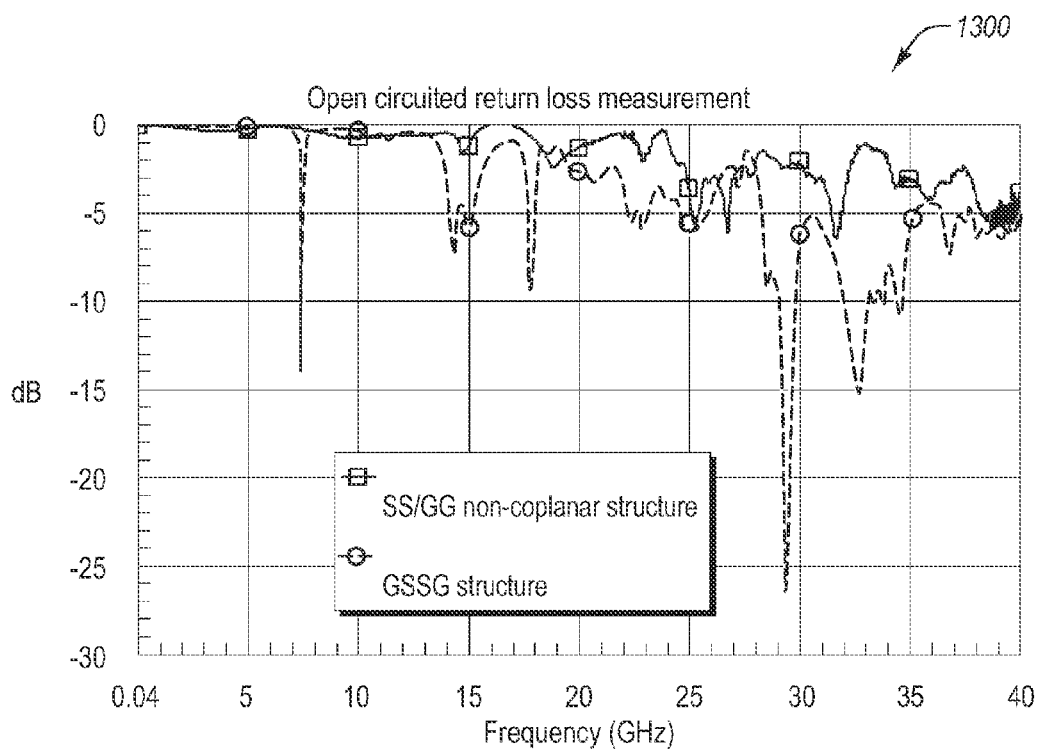
FIG. 13 is a chart comparing the measured open circuit return loss of the GSSG interconnect test coupon of FIG. 12 and the example SS/GG interconnect test coupon of FIG. 11.

FIG. 13 is a chart 1300 comparing the measured open circuited return loss of the GSSG interconnect test coupon 1202 of FIG. 12 and the example SS/GG interconnect test coupon 1102 of FIG. 11. Due to a limitation of probes having a pitch of 1.6 mm, the measurement results disclosed in FIG. 13 were obtained by employing an open circuited return loss measurement. The measurement results disclosed in FIG. 13 were obtained by measuring the GSSG interconnect test coupon 1202 and the example SS/GG interconnect test coupon 1102 from the top. The measurements of the GSSG interconnect test coupon 1202 and the example SS/GG interconnect test coupon 1102 were conducted using the 250 um GSSG probe 1104 with a calibrated vector network analyzer (VNA). The results disclosed in FIG. 13 were obtained by connecting the probe 1104 at the first reference plane 1106 with the second reference plane 1108 being open circuited. As disclosed in FIG. 13, the example SS/GG interconnect test coupon 1102 exhibits an average of about 2 dB improvement in return loss from about 15 GHz to about 35 GHz in comparison with the GSSG interconnect test coupon 1202.

Figure 14:
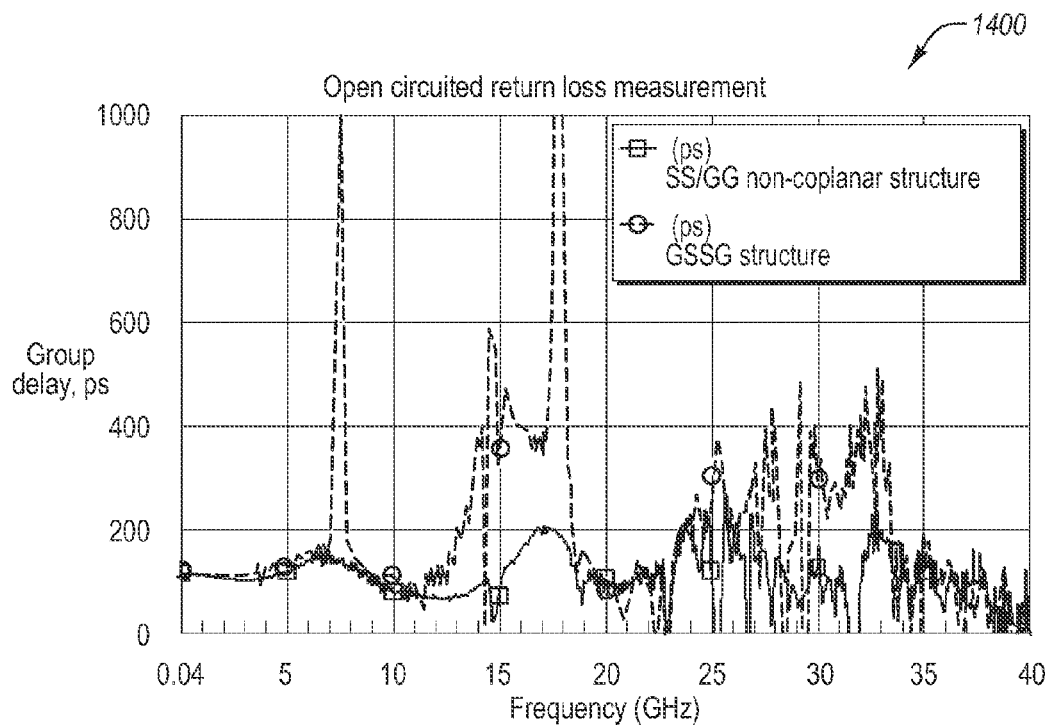
FIG. 14 is a chart comparing the measured group delay characteristics of the GSSG interconnect test coupon of FIG. 12 and the example SS/GG interconnect test coupon of FIG. 11.

FIG. 14 is a chart 1400 comparing the measured group delay characteristics of the GSSG interconnect test coupon 1202 of FIG. 12 and the example SS/GG interconnect test coupon 1102 of FIG. 11. As disclosed in FIG. 14, the example SS/GG interconnect test coupon 1102 exhibits a group delay flatness within the range from about 0 ps to about 250 ps over the bandwidth in comparison with the GSSG interconnect test coupon 1202 which exhibits a range from about 0 ps to about 1000 ps.

It is noted that the smoothness of all measured curves may be improved above about 15 GHz by replacing the probe 1104 with a thin-film probe (not shown), which reduces unwanted couplings between probe tips with better field confinement.

II. Example Multi-Channel Non-Coplanar Interconnects

Figure 15:
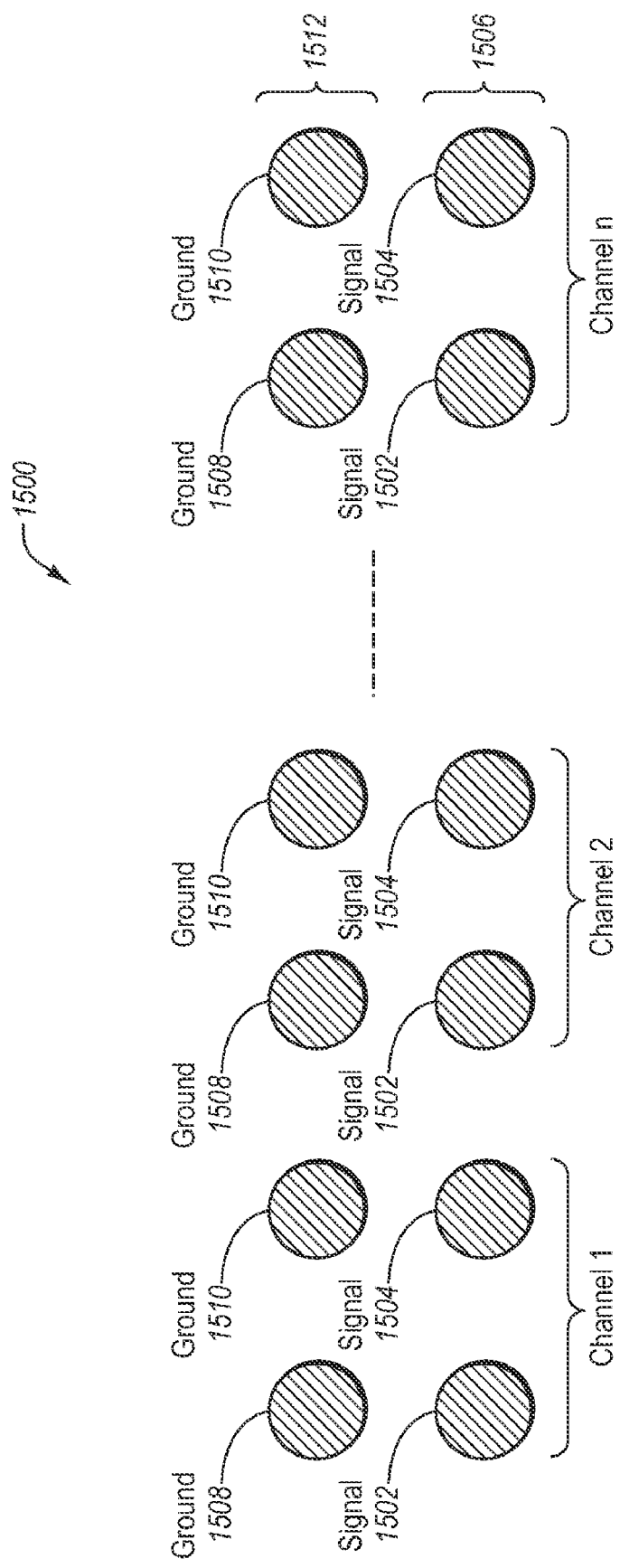
FIG. 15 is a top view of an example multi-channel non-coplanar SS/GG interconnect.

FIG. 15 is a top view of an example multi-channel non-coplanar SS/GG interconnect 1500. One environment in which the example multi-channel non-coplanar SS/GG interconnect 1500 can be employed is high-speed transponders. For example, transceivers or transponders compliant with the CFP MSA (such as revision 0.3 dated Aug. 29, 2008 or other revisions) may employ the example multi-channel non-coplanar SS/GG interconnect 1500. Transceiver or transponders compliant with the CFP MSA are configured to support 40 G and 100 G interfaces for Ethernet, Telecommunication and other applications. It is noted, however, that the example multi-channel non-coplanar SS/GG interconnect 1500 is not limited to employment in high-speed transceivers or transponders, but can also be employed in any environment where a multi-channel interconnect between two sets of high-speed transmission lines is necessary.

As disclosed in FIG. 15, the example multi-channel non-coplanar SS/GG interconnect 1500 includes n channels. Each channel can be configured to transmitting high-speed signals at a predetermined speed. For example, in a 100 G transponder, the example multi-channel non-coplanar SS/GG interconnect 1500 may include four channels, each of which being configured to transmit high-speed signals at a speed of about 25 G for a total speed of about 100 G.

As disclosed in FIG. 15, each channel of the example multi-channel non-coplanar SS/GG interconnect 1500 includes two signal transmission lines 1502 and 1504 arranged in a first plane 1506 and two ground transmission lines 1508 and 1510 arranged in a second plane 1512. Unlike a conventional multi-channel coplanar GSSG interconnect, the example SS/GG interconnect 500 has a non-coplanar geometry. The example SS/GG interconnect 500 can be employed in a high-speed application to connect a first set of GSSG differential pair transmission channels to a second set of GSSG differential pair transmission channels, for example, on first and second layers of a multi-layer package.

Although each channel of the example multi-channel non-coplanar interconnect 1500 is configured as an SS/GG channel, other channel configurations, such as S/GG or SS/GGG, can similarly be employed. In addition, the channels of the example multi-channel non-coplanar interconnect 1500 may include a single channel configuration, such as SS/GG, or some combination of channel configurations, such as a combination of SS/GG, S/GG, and SS/GGG configurations.

In a conventional multi-channel coplanar GSSG interconnect employed in a 100 G Ethernet application, data transmission and receiving (Tx/Rx) through a single channel can give rise to challenges for both design and manufacture processes. Thus, a multi-channel Tx/Rx design is often adopted to ease the design and manufacture in a single channel. However, the compact form factor required for a 100 G transponder requires interconnects and packages inside the transponder housing it to be space efficient. The example multi-channel non-coplanar SS/GG interconnect 1500 improves space efficiency by 100% as compared to a conventional multi-channel coplanar GSSG interconnect having n channels (not shown). In other words, the width of the example multi-channel non-coplanar SS/GG interconnect 1500 is 50% narrower than a conventional multi-channel coplanar GSSG interconnect having n channels.

The example multi-channel non-coplanar SS/GG interconnect 1500 disclosed herein can exhibit favorable RF performance in high-speed applications, and can also improve space efficiency in a multi-channel design. It is also noted that the comparisons disclosed in FIGS. 9, 10, 13, and 14 based on single channel simulation and measurement are applicable to comparisons between the example multi-channel non-coplanar SS/GG interconnect 1500 and a conventional multi-channel coplanar GSSG interconnect (not shown).

The example embodiments disclosed herein may be embodied in other specific forms. The example embodiments disclosed herein are to be considered in all respects only as illustrative and not restrictive.

What is claimed is:

1. A high-speed package comprising:
    a first layer comprising first and second sets of coplanar transmission lines;
    a second layer comprising third and fourth sets of coplanar transmission lines; and
    a multi-channel non-coplanar interconnect comprising first and second channels, the first channel connecting the first set of transmission lines to the third set of transmission lines, the second channel connecting the second set of transmission lines to the fourth set of transmission lines.

2. The high-speed package as recited in claim 1, wherein each channel of the multi-channel non-coplanar interconnect is capable of transmitting high-speed signals at a speed of about 25 G.

3. The high-speed package as recited in claim 1, wherein each channel of the multi-channel non-coplanar interconnect comprises:
    a first plane of ground transmission lines; and
    a second plane of signal transmission lines, the second plan being substantially parallel to the first plane.

4. The high-speed package as recited in claim 1, wherein the high-speed package comprises an integrated circuit package or an optoelectric circuit package.

5. The high-speed package as recited in claim 1, wherein the first channel comprises an SS/GG channel.

6. The high-speed package as recited in claim 5, wherein the second channel comprises an SS/GG channel.

7. The high-speed package as recited in claim 5, wherein the second channel comprises an S/GG channel.

8. The high-speed package as recited in claim 5, wherein the second channel comprises an SS/GGG channel.

9. A high-speed transponder comprising:
    a printed circuit board comprising first and second sets of coplanar traces;
    a first package mounted to the printed circuit board, the first package comprising first and seconds sets of coplanar transmission lines;
    a first non-coplanar multi-channel interconnect comprising first and second channels, the first channel connecting the first set of traces to the first set of transmission lines, the second channel connecting the second set of traces to the second set of transmission lines.

a second package mounted to the printed circuit board, the second package comprising third and fourth sets of coplanar transmission lines; and a second non-coplanar multi-channel interconnect comprising third and fourth channels, the third channel connecting the first set of traces to the third set of transmission lines, the fourth channel connecting the second set of traces to the fourth set of transmission lines.

10. The high-speed transponder as recited in claim 9, wherein the high-speed transponder is capable of transmitting high-speed signals between the first and second packages at speeds of about 100 G.

11. The high-speed transponder as recited in claim 9, wherein each channel of the non-coplanar multi-channel high-speed interconnect comprises:
   a first plane of ground transmission lines; and
   a second plane of signal transmission lines, the second plane being substantially parallel to the first plane.

12. The high-speed transponder as recited in claim 9, wherein:
   the first package comprises an integrated circuit package;
   the second package comprises an optoelectric circuit package.

13. The high-speed transponder as recited in claim 9, wherein the first and third channels each comprises an SS/GG channel.

14. The high-speed transponder as recited in claim 13, wherein the second and fourth channels each comprises an SS/GG channel.

15. The high-speed transponder as recited in claim 13, wherein the second and fourth channels each comprises an S/GG channel.

16. The high-speed transponder as recited in claim 13, wherein the second and fourth channels each comprises an SS/GGG channel.

17. A high-speed transponder comprising:
   a printed circuit board comprising first and second sets of coplanar traces;
   an integrated circuit package mounted to the printed circuit board, the integrated circuit package comprising first and seconds sets of coplanar transmission lines;
   a first non-coplanar multi-channel interconnect comprising first and second channels, the first channel connecting the first set of traces to the first set of transmission lines, the second channel connecting the second set of traces to the second set of transmission lines,
   an optoelectric circuit package mounted to the printed circuit board, the optoelectric circuit package comprising third and fourth sets of coplanar transmission lines; and
   a second non-coplanar multi-channel interconnect comprising third and fourth channels, the third channel connecting the first set of traces to the third set of transmission lines, the fourth channel connecting the second set of traces to the fourth set of transmission lines.

18. The high-speed transponder as recited in claim 17, wherein the first and third channels each comprises an SS/GG channel.

19. The high-speed transponder as recited in claim 17, wherein the high-speed transponder is capable of transmitting high-speed signals between the integrated circuit package and the optoelectric circuit package at speeds of about 100 G.

20. The high-speed transponder as recited in claim 17, wherein each channel of the non-coplanar multi-channel high-speed interconnect comprises:
   a first plane of ground transmission lines; and
   a second plane of signal transmission lines that is substantially parallel to the first plane.

* * * * *